United States Patent [19]
Ashley et al.

[11] Patent Number: 5,382,814
[45] Date of Patent: Jan. 17, 1995

[54] SEMICONDUCTOR DEVICE WITH LOW THERMALLY GENERATED LEAKAGE CURRENT

[75] Inventors: Timothy Ashley; Charles T. Elliott; Colin R. Whitehouse, all of Worcester, United Kingdom

[73] Assignee: The Secretary of State for Defence in Her Britannic Majesty's Government of the United Kingdom of Great Britain and Nothern Ireland, United Kingdom

[21] Appl. No.: 84,280

[22] PCT Filed: Dec. 19, 1991

[86] PCT No.: PCT/GB91/02270
§ 371 Date: Aug. 12, 1993
§ 102(e) Date: Aug. 12, 1993

[87] PCT Pub. No.: WO92/12540
PCT Pub. Date: Jul. 23, 1992

[30] Foreign Application Priority Data
Jan. 8, 1991 [GB] United Kingdom ............... 9100351

[51] Int. Cl.$^6$ ............................................. H01L 27/14
[52] U.S. Cl. .................................... 257/197; 257/192
[58] Field of Search ................. 257/183, 183.1, 184, 257/82, 197, 192, 196, 198, 199

[56] References Cited
U.S. PATENT DOCUMENTS

| | | | |
|---|---|---|---|
| 4,329,625 | 5/1982 | Nishizawa et al. | 252/82 |
| 4,926,228 | 5/1990 | Ashley et al. | 257/78 |
| 5,016,073 | 5/1991 | Elliott et al. | 257/184 |

FOREIGN PATENT DOCUMENTS

| | | |
|---|---|---|
| 0167305 | 6/1985 | European Pat. Off. |
| WO90/06597 | 6/1990 | WIPO . |

OTHER PUBLICATIONS
Ashley et al, Ambient Temperature Diodes And Field-Effect Transistors in InSb/In, 1991, 3 pages.

Primary Examiner—Robert P. Limanek
Assistant Examiner—Alexander Oscar Williams
Attorney, Agent, or Firm—Nixon & Vanderhye

[57] ABSTRACT

A semiconductor device in the form of a metal insulator field effect transistor (MISFET) (200) is constructed as a heterostructure of narrow bandgap $In_{1-x}Al_xSb$ semiconductor materials. The MISFET (200) is formed from four semiconducting layers (112 to 118) arranged in series as follows: a heavily doped p-type first layer (112), a heavily doped relatively wider bandgap p-type second layer (114), a lightly doped p-type third layer (116) and a heavily doped n-type fourth layer (118). A source (202) and a drain (204) are formed in the fourth layer (118) and a gate (116/205) in the third layer. An $n^+p^-$ junction (124) is formed between the third and fourth layers and a $p^+p^-$ junction (122) between the second and third layers. The second layer (114) provides a conduction band potential energy barrier to minority carrier (electron) flow to the gate (116/205), and is sufficiently wide to prevent tunnelling of minority carriers therebetween. The first and second layers (112, 114) in combination provide a $p^+p^+$ excluding contact to the third layer (116). The $n^+p^-$ junction (124) between the third and fourth layers (116, 118) is an extracting contact; when reverse biased in operation, this junction (124) extracts minority carriers from the region of the third layer (116) adjacent the collector (118/204). In operation, the third layer (116) incorporating the gate (205) becomes depleted of charge carriers and therefore exhibits greatly reduced leakage current. In consequence, the MISFET (200) has good dynamic range in terms of controllable drain current. The invention also provides bipolar transistors (300, 400 ) and related devices.

19 Claims, 6 Drawing Sheets

SEMICONDUCTOR DEVICE WITH LOW THERMALLY GENERATED LEAKAGE CURRENT

BACKGROUND OF THE INVENTION

1. FIELD OF THE INVENTION

This invention relates to a semiconductor device. More particularly, though not exclusively, it relates to such devices which are heterostructures of narrow bandgap semiconductor materials.

2. DISCUSSION OF PRIOR ART

Narrow bandgap semiconductors such as InSb have useful properties such as very low electron effective mass, very high electron mobility and high saturation velocity. These are potentially of great interest for high speed device applications. Unfortunately it has proved difficult to overcome the drawbacks of these materials. A prior art three terminal active device which is a narrow bandgap semiconductor material heterostructure is described by T Ohashi et al in J Vac Sci Technol B4 622 (1986). It is a thin film depletion mode field effect transistor (FET) device, and consists of an InSb film on a GaAs substrate. However, the device of Ohashi et al unfortunately has poor performance, a high leakage current in particular. It has a dynamic range of only 7dB, and so its current in an ON state is only about twice ($5^{\frac{1}{2}}$) that in an OFF state. This exemplifies the difficulty of exploiting the useful properties of narrow bandgap semiconductors.

European Patent Application No.8530405.1-2203 published as No. 0 167 305 corresponding to U.S. Pat. No. 5,016,073 discloses photodiodes having two or more terminals and formed as heterostructures of semiconductor materials. There is no disclosure of field effect transistors or bipolar transistors.

SUMMARY OF THE INVENTION

It is an object of the invention to provide an alternative form of semiconductor device.

The present invention provides a semiconductor device having first, second and third semiconducting regions connected in series for current input, current control and current output respectively and each arranged to be biased by a respective biasing means, the device incorporating an extracting contact arranged to extract minority carriers from the second region, and the second region being of low doping and having a common interface with a fourth semiconducting region itself having a common interface with a fifth semiconducting region, and wherein the fourth region:

(a) has like majority carrier type to that of the fifth region.

(b) is biasable through the fifth region and is arranged to act as an excluding contact to exclude minority carriers from at least parts of the second region adjacent the third region and thereby to reduce the intrinsic contribution to current reaching the third region, (c) has a bandgap sufficiently large to provide a potential energy barrier to minority carrier flow from the fifth region to the second region, (d) has sufficiently high doping to counteract potential barrier impediment to majority carrier flow from the second region to the fifth region, and (e) is less wide than a critical thickness associated with dislocation formation but sufficiently wide to inhibit tunnelling of minority carriers from the fifth region to the second region.

The expressions "extracting contact" and "excluding contact" are known in the art of semiconductor devices. The former relates to a junction which gathers minority carriers which diffuse to it, and the latter a junction which accepts majority carriers but does not supply minority carriers.

The invention provides the advantage that it makes possible the production of devices not produced in the prior art and the attainment of improved dynamic range: an enhancement mode field effect transistor embodiment of the invention formed from narrow bandgap semiconductor material has exhibited a dynamic range of 23dB. Such an FET device has not been made in the prior art. Moreover, this embodiment has a dynamic range which is a 16dB improvement over a prior art depletion mode device formed from narrow bandgap semiconductor material. In such embodiment of the invention, the first, second and third regions are source, gate and drain regions respectively, and the first and third regions are of like majority carrier type opposite to that of the second, fourth and fifth regions.

The invention may alternately be arranged as a depletion mode field effect transistor, in which case the first, second and third regions are source, gate and drain regions of like majority carrier type opposite to that of the fourth and fifth regions.

The second region may be a layer having first and second sides separated by the layer thickness, the first and third regions being connected to the first side of the second region, the fourth region being connected to the second side of the second region and the fifth region being connected to a side of the fourth region remote from the first, second and third regions. The fourth region may be connected to the second region over an area at least as extensive and correspondingly located as those parts of the second region adjacent and between the first and third regions, the fourth region being arranged to provide minority carrier exclusion over most or all of the second region.

A device of the invention may have constituent semiconductor materials with narrow bandgaps, i.e. bandgaps less than 0.5eV.

In a preferred embodiment, the invention is an enhancement mode field effect transistor having the following constituent regions:

(a) first and third regions of InSb having an n-type dopant concentration of at least $2 \times 10^{17}$ atoms/cm$^3$, (b) a second region of InSb having a p-type dopant concentration of less than $1 \times 10^{17}$ atoms/cm$^3$, a fourth region of In$_{1-x}$Al$_x$Sb having a p-type dopant concentration of at least $5 \times 10^{17}$ atoms/cm$^3$ where x is a compositional parameter in the range 0.01 to 0.7, and (d) a fifth region of InSb with a p-type dopant concentration of at least $5 \times 10^{17}$ atoms/cm$^3$.

The invention may be formed from a series of layers disposed successively on a common substrate, the fifth region being a first layer supported by the substrate, the fourth region being a second layer in contact with the fifth layer, the second region being a third layer in contact with the second layer, and the first and third regions being formed from a common fourth layer in contact with the third layer.

In an alternative embodiment, the invention is a bipolar transistor in which the first, second and third regions are emitter, base and collector regions respectively, and the first and third regions are of like majority carrier type opposite to that of the second, fourth and fifth regions. In a preferred version of this embodiment, the second region is a layer having first and second sides separated by the layer thickness, the first and third regions are connected respectively to the first and second sides of the second region, the fourth region is connected on one side to the first side of the second region and on the other side to the fifth region. The second region may have a further biasing means connected to a different part of the second region to that to which the fourth region is connected; this further biasing means may be biasable independently of the fourth region and may incorporate semiconducting regions of like composition to those of the fourth and fifth regions. The further biasing means and the fourth region may be annular and disposed around the first region.

A bipolar transistor of the invention may incorporate the following:
(a) first and third regions of InSb having an n-type dopant concentration of at least $2 \times 10^{17}$ atoms/cm$^3$,
(b) a second region of InSb having a p-type dopant concentration of less than $1 \times 10^{17}$ atoms/cm$^3$,
(c) a fourth region of $In_{1-x}Al_xSb$ having a p-type dopant concentration of at least $5 \times 10^{17}$ atoms/cm$^3$, where x is a compositional parameter in the range 0.01 to 0.7, and
(d) a fifth region of InSb with a p-type dopant concentration of at least $5 \times 10^{17}$ atoms/cm$^3$.

A device of the invention may incorporate a fourth region of semiconductor bandgap at least $(3kT/q)$ Volts, preferably $(5kT/q)$ Volts, wider than that of either the second region or the fifth region, where k is the Boltzmann constant, T the absolute temperature and q the electronic charge.

BRIEF DESCRIPTION OF THE DRAWINGS

In order that the invention might be more fully understood, embodiments thereof will now be described, by way of example only, with reference to the accompanying drawings, in which.

DETAILED DESCRIPTION OF PREFERRED EMBODIMENTS

Figure 1:
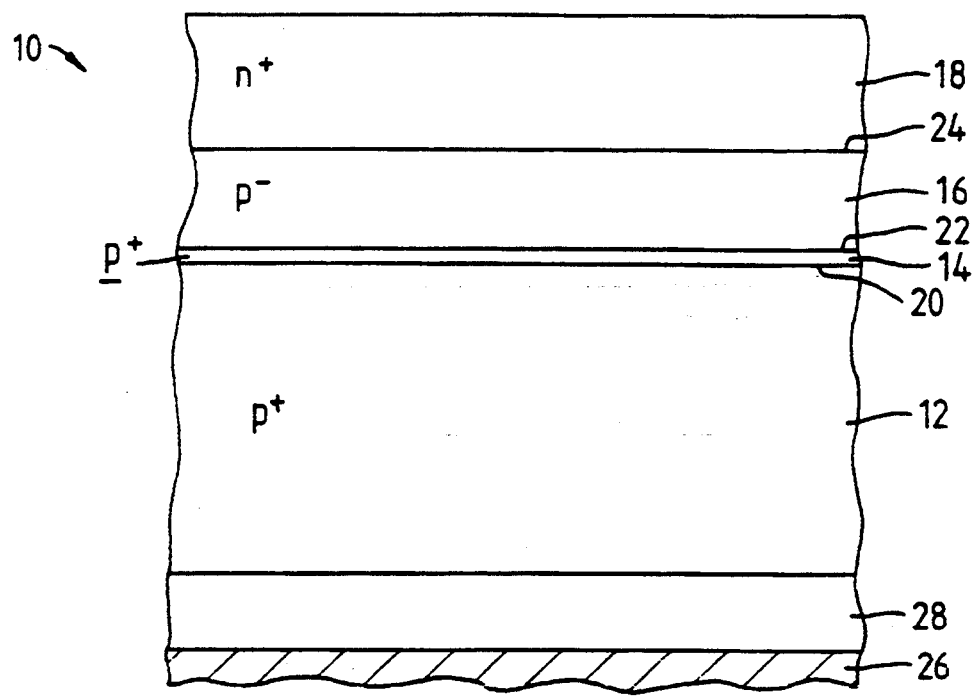
FIG. 1 schematically illustrates a semiconductor heterostructure.

Referring now to FIG. 1, there is shown schematically a semiconductor multilayer heterostructure 10 suitable for constructing devices of the invention. The heterostructure 10 consists of indium antimonide (InSb) and indium aluminium antimonide ($In_{1-x}Al_xSb$) alloys. It has four regions of semiconductor material as follows: a heavily doped narrow bandgap p-type (p+) region 12, a relatively wide bandgap heavily doped narrow bandgap p-type ($\underline{p}$+) region 14, a lightly doped p-type (p−) region 16 and a heavily doped narrow bandgap n-type (n+) region 18. In this specification a superscript minus (−) or plus (+) indicates light or heavy doping respectively, the absence of a superscript indicates an intermediate doping level. The bar () subscript indicates material of wide bandgap relative to the bandgap of material denoted without the bar. Adjacent pairs of the regions 12, 14, 16 and 18 have respective intermediate regions indicated by lines 20, 22 and 24, and which p+$\underline{p}$+, $\underline{p}$+p− and p−n+ junctions respectively. Regions 20 and 22 are heterojunctions and region 24 is a homojunction, and all three are referred to as junctions hereinafter.

The heterostructure 10 is grown in a VG V80H MBE system on a p-type (cadmium doped to $3 \times 10^{14}$cm$^{-3}$) (001) InSb substrate 26. Adjacent to the substrate 26 is a buffer and temperature ramp region 28 grown whilst the MBE system was being set up correctly to grow the heterostructure 10. The growth temperature was approximately )420° C. and the growth race was 0.5 micronshr$^{-1}$. Mesa diode fabrication is performed using standard photolithographic techniques, on the heterostructure 10, to define chemically etched structures.

The p+, p−and n+regions 12, 16, 18 consist of InSb of widths 2.15 microns, 3.15 microns, and 3.0 microns respectively. InSb has a bandgap of 0.18eV at room temperature. The $\underline{p}$+ region 14 consists of $In_{0.9}Al_{0.1}Sb$ of width 0.02 microns. $In_{0.9}Al_{0.1}Sb$ has a bandgap at room temperature of 0.36eV, twice the bandgap of InSb. Dopants are silicon (Si) for n-type and beryllium (Be) for p-type. Doping in regions 12 and 14 is $5 \times 10^{18}$atoms cm$^{-3}$, in region 16 is $1 \times 10^{15}$ atoms cm$^{-3}$ and in region 18 is $1 \times 10^{18}$atoms cm$^{-3}$.

Figure 2:
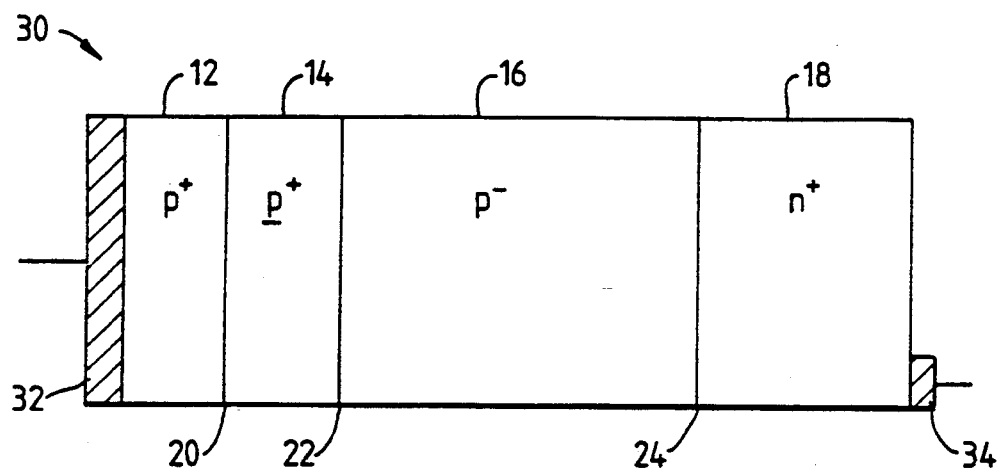
FIG. 2 schematically illustrates a semiconductor heterostructure in the form of an extracting diode.

Referring now to FIG. 2, there is shown schematically a semiconductor device 30 in the form of a diode. The diode 30 will be described in order to clarify the roles of excluding contacts, extracting contacts and potential barriers employed in devices of the invention. Parts common to FIG. 1 are like referenced. The diode 30 is composed of regions 12, 14, 16 and 18 with intervening junctions 20, 22 and 24 as described with reference to FIG. 1. As will be described later, the $\underline{p}$+p−junction 22 forms an excluding contact and the p−n+junction 24 forms an extracting contact. Electrodes to the diode 30 are provided at 32 and 34 for bias voltage application.

Region 12 provides a narrow bandgap region to which the electrode 32 may be attached and the width of this region is not critical. In this embodiment region 12 has width of 2.15 microns between electrode 32 and junction 22. Region 14 must have sufficient width such that minority carriers are substantially prevented from tunnelling from region 12 to region 16, that is wider than about 2nm. This is discussed in more detail later.

However, region 14 must also be narrower than the critical width for strain relief; this critical width is a term of art for the layer thickness, which, if exceeded, results in the layer failing to accommodate strain associated with conformity with the layer's substrate crystal lattice. Layers with widths above the critical width have dislocations giving rise to unwanted energy states which conflict with device operation. In $In_{0.9}Al_{0.1}Sb$, the critical width is estimated to be 50nm (from a model by J W Matthews and A E Blakeslee in J Crystal Growth 27, 118 (1975), Region 14 has a width between junctions 20 and 22 of 20nm, less than half the estimated critical width. Region 16 should have a thickness between junctions 22 and 24 which is not greater than a minority carrier diffusion length, in order that the minority carrier exclusion and extraction effects produced within it by these junctions extend throughout its thickness, it is also important that there is no source of minority carriers to region 16, that is no electrical connections through which minority carriers may be injected into this region. If there were such a source, exclusion and extraction effects would be nullified.

In the diode 30 region 16 has a width between junctions 22 and 24 of 3.15 microns. Region 18 provides for carrier extraction; its width should be greater than a minority carrier diffusion length, e.g. a width between junction 24 and electrode 34 of 3.0 microns.

Figure 3:
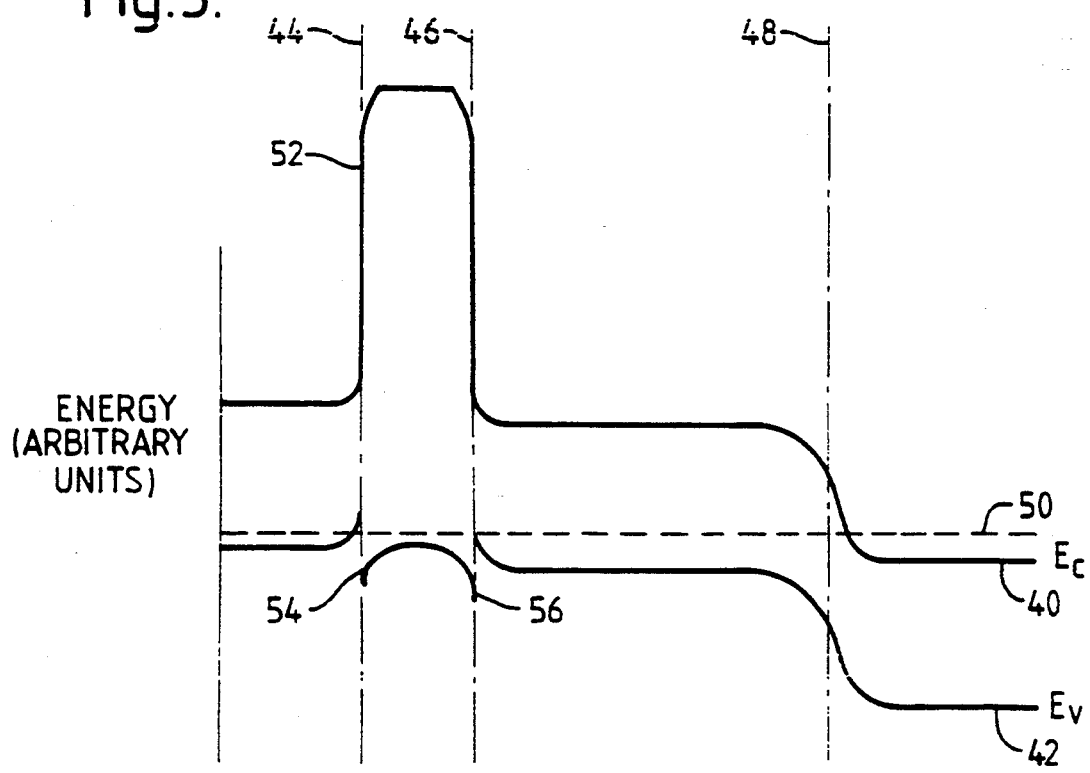
FIG. 3 graphically illustrates variation of conduction band and valence band edge energies along the FIG. 2 diode.

Referring now also to FIG. 3, this provides curves 40 and 42 illustrating graphically the variation in conduction and valence band edge energies, $E_c$ and $E_v$ respectively, along the diode 30, at zero bias. Chain lines 44, 46 and 48 indicate positions of junctions 20, 22 and 24 respectively. A dashed line 50 indicates the Fermi level through the diode 30. The $p^+$ region 14 produces a potential barrier 52 in the conduction band which prevents minority carriers (electrons) from the p+ region 12 entering the p− region 16. In addition, because the bandgap of the $p^+$ region 14 is wider than that of other regions, electron generation in it by thermal excitation is relatively small. The $p^+p^-$ junction 22 therefore forms an excluding contact which excludes electrons (minority carriers) from reaching the region 16 from its left. The $p^+$ region 14 must, however be sufficiently wide to prevent any substantial degree of minority carrier transport from region 12 to region 16 by quantum mechanical tunnel effect through the potential barrier 52.

The width required for the region 14 is a function of the form of the potential energy barrier 52 and the carrier effective mass. An approximate analysis is derived from R. A. Smith, "Wave Mechanics of Crystalline Solids" 2nd edition, Chapman and Hall (1969) page 56, for a rectangular barrier with equal conduction and valence band edge energies, $E_c$ and $E_v$, on either side of the barrier. Moreover the electric field developed across the barrier 52 should be small so that there is little resistance to the majority carrier flow. In the case of a conduction band barrier to electron flow, the proportion of electrons. P, which will penetrate the barrier is given by:

$$P = \frac{\int_{E_c}^{\infty} N(E)F(E)t(E)dE}{\int_{E_c}^{\infty} N(E)F(E)dE} \quad (1)$$

where E is the electron energy with $E_c$ defined to be zero, N(E) is the density of states in the conduction band, F(E) is the Fermi function and t(E) is the tunnelling probability per electron. The tunnelling probability per electron is given by:

$$t(E) = \frac{16(W-E)E}{\{(W-2E)(e^{-ba} - e^{ba})\}^2 + 4(W-E)E(e^{-ba} + e^{ba})^2} \quad (2)$$

where W is the barrier height, a is the barrier width (i.e. the width of region 14) and b is given by:

$$b = 2\pi\{2m^*(W-E)\}^{\frac{1}{2}}/h \quad (3)$$

where $m^*$ is the electron effective mass and h is Planck's constant.

A consequence of a valence band offset is a discontinuity spike such as 54 or 56. This may cause a barrier to majority carrier (hole) flow which is undesirable. Therefore doping in the $p^+$ region 14 is arranged to be sufficiently high for tunnelling through the spikes 54, 56 to occur, thus effectively removing the barrier to hole flow. Alternatively some degree of compositional grading may be employed at the heterojunctions 20 and 22 to prevent the formation of discontinuity spikes 54 and 56. This involves a gradual change of the compositional parameter x' in $In_{1-x'}Al_{x'}Sb$ from 0 to x' and x' to 0 respectively over distances of the order of 10nm at these heterojunctions. Such compositional change is well known in the art and will not be described.

The diode 30 operates as follows. Electrode 32 is negatively biased with respect to electrode 34. The $p^-n^+$ homojunction 24 provides the rectifying characteristics of the diode 30, and is reverse biased. As mentioned previously the $p^+p^-$ heterojunction 22 provides an excluding contact, that is holes (majority carriers) flow freely from region 16 to region 14 but only a small electron (minority carrier) current may flow in the reverse direction from region 14 to region 16. In addition junction 24 provides an extracting contact, because electrons diffuse from region 16 to region 18 as a result of the lower conduction band edge energy in region 18. In consequence, electrons in region 16 which diffuse to the reverse biased $p^-n^+$ junction 24 are extracted to the region 18, and cannot be replenished from the region 14 because of the excluding contact properties of junction 22. The electron (minority carrier) concentration in region 16 consequently falls when the diode 30 is reverse biased, and charge neutrality considerations dictate that the hole (majority carrier) concentration fall with it. The combination of these two effects is to reduce the intrinsic contribution to conduction in the region 16 when the diode 30 is reverse biased. The intrinsic contribution is that arising from excitation of valence electrons, as opposed to the extrinsic contribution arising from excitation of impurity states. In the absence of bias, the region 16 is intrinsic at the diode operating temperature, i.e. conductivity is predominantly that due to thermal ionisation of valence electrons. Under bias, a dynamic situation arises in which carrier concentrations fall sufficiently such that the region 16 behaves extrinsically at the operating temperature. i.e. conductivity becomes predominantly that due to thermal ionisation of impurity states.

The existence of negative differential resistance in the reverse bias current-voltage characteristics of devices of the type described in the prior art has been described by, for example, A. M. White in Infrared Physics, Vol 27, No 6, (1987) page 361. This negative differential resistance arises from the suppression of Auger generation mechanisms in the intrinsic region 16 of the diode 30 as free carriers are removed by the application of a reverse bias, leading to a reduction in the diode leakage current. The effect is significantly stronger in devices of the invention, and provides the advantage of reduced leakage current and improved performance.

Devices of the invention based on the general form of the heterostructure 10 may have regions equivalent to regions 12, 14, 16 and 18 but of different widths. The criteria for region widths discussed above indicate that these widths should fall within the following ranges. Region 12 may have a width greater than 0.1 microns, region 14 a width in the range 2nm up to the critical thickness associated with strain relief, region 16 a width less than or of the order of 3 microns and region 18 a width greater than 0.1 microns.

Doping levels and the dopants used may also vary with the exact requirements for device operation. Doping in p+ region 12 should be sufficiently high that conductivity is extrinsic, i.e. it should be predominantly due to majority carrier (hole) transport at the temperature of operation; High doping in region 12 minimises the series resistance presented by this region. A value of at least $5 \times 10^{17}$ atoms cm$^{-3}$, preferably at least $1 \times 10^{18}$ atoms cm$^{-3}$ is appropriate. Doping in p+ region 14 is preferably sufficiently high to allow tunnelling of majority carriers through valence band discontinuity spikes at junctions 20 and 22. The acceptor concentration $N_a$ in region 14 should be at least $5 \times 10^{17}$ atoms cm$^{-3}$, preferably at least $1 \times 10^{18}$ atoms cm$^{-3}$. Doping in p$^-$ region 16 should be sufficiently low to produce predominantly intrinsic characteristics at the diode operating temperature at zero bias, that is $N_A$ not greater than $1 \times 10^{17}$ atoms cm$^{-3}$ for ambient temperature operation. Doping in n+ region 18 should be sufficiently high to produce strong degeneracy and minimise hole injection in p$^-$ region 16; Region 18 should therefore have a donor concentration $N_D$ of at least $2 \times 10^{17}$ atoms cm$^{-3}$, preferably $1 \times 10^{18}$ atoms cm$^{-3}$. The doping levels given above are electrically active levels. Regions 12 and 14 will always be of like majority carrier type opposite to that of region 18. However region 16 may be p-type or n-type. The rectifying junction may therefore be junction 22 or 24. If junction 22 were to be rectifying, junction 24 would function as the excluding contact.

In an InSb/In$_{1-x}$Al$_x$Sb heterostructure used to provide devices of the invention, the material of region 16 may have a value of the parameter x in the range 0.01 to 0.7, preferably 0.1 to 0.3. However the invention is not limited to InSb/InAlSb heterostructures but may be constructed from a variety of different semiconductor materials.

Figure 4:
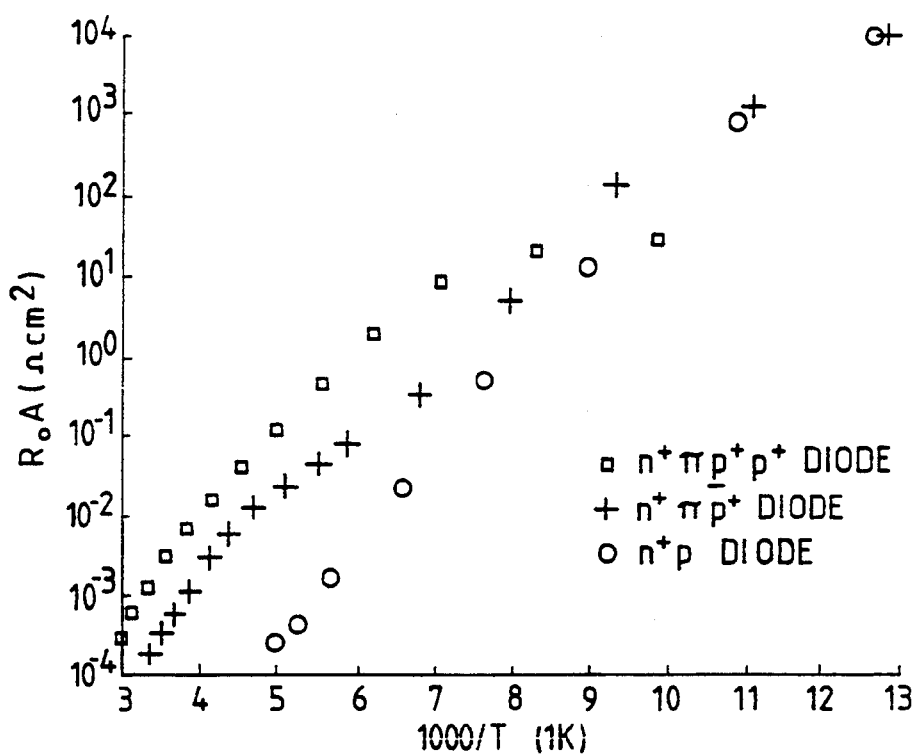
FIG. 4 graphically illustrates variation of the product of zero bias resistance and area with temperature for diodes respectively with and without minority carrier barrier layers.

A figure of merit for diodes is the zero bias resistance $R_0$ multiplied by the diode junction area A, hence $R_0A$. Referring now to FIG. 4, the variation of $R_0A$ with the inverse of the temperature (x1000) is illustrated graphically for an InSb diode 30 and for two diodes without barriers equivalent to 52. Data points plotted with a square symbol correspond to the diode 30, and the like for the two other diodes are represented by crosses and circles respectively. The higher the value of $R_0A$ the better the performance of a diode. From FIG. 4 it can be seen that the diode 30 is significantly better than the other two for all temperatures above 130K.

Figure 5:
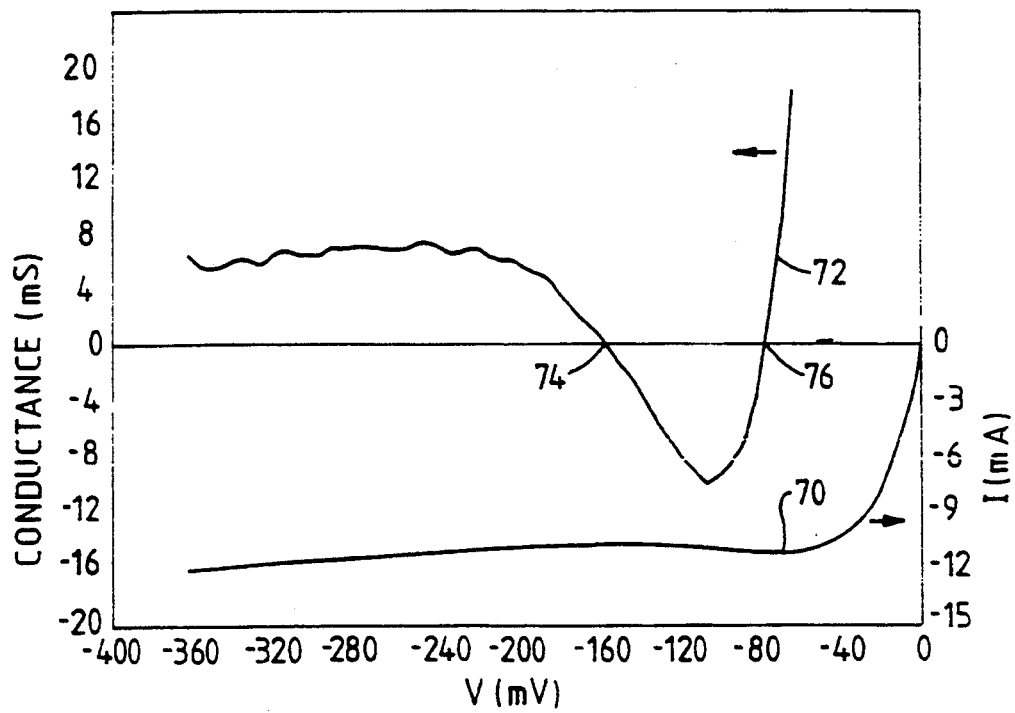
FIG. 5 graphically illustrates the reverse bias current-voltage and differential conductance-voltage characteristics, at 70° C., of an InSb diode of the invention.
Figure 7A:
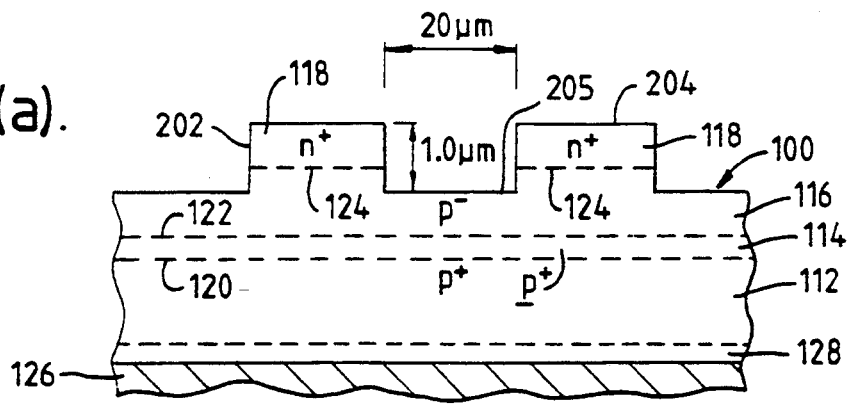
FIG. 7(a-d) schematically illustrates stages in the fabrication of a MISFET of the invention from the heterostructure of FIG. 6.
Figure 7B:
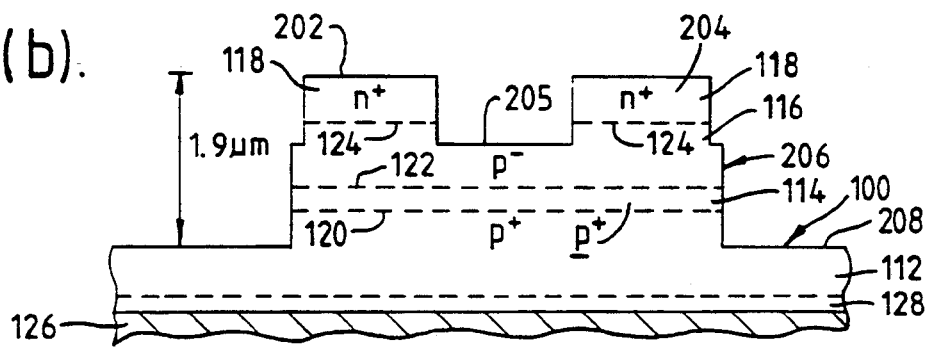
Figure 7C:
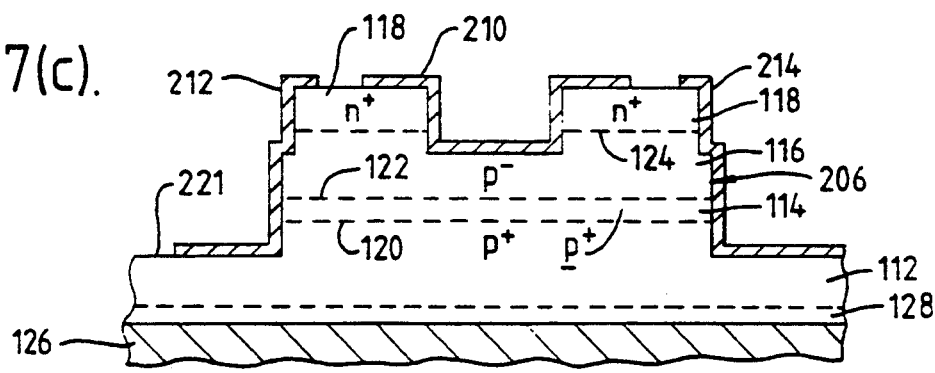
Figure 7D:
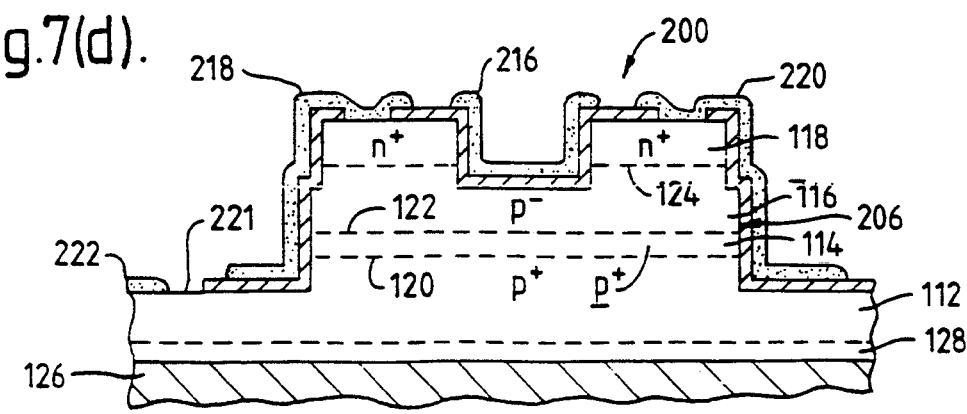

Referring now to FIG. 5, reverse bias current-voltage and differential conductance-voltage characteristics are illustrated graphically by curves 70 and 72 respectively, for a diode operating at 70° C. The axis for current is shown on the right of FIG. 5 with units of mA. The axis for conductance is shown on the left of FIG. 5 with units of mS. The diode used to obtain the results of FIG. 5 will be referred to as 30′, since it was as described above for diode 30, with the exception that region 14 comprised material with composition In$_{0.8}$Al$_{0.2}$Sb. Curve 72 illustrates a negative conductance between points 74 and 76. Thus the diode 30′ illustrated negative differential resistance, of the kind described above.

Figure 6:
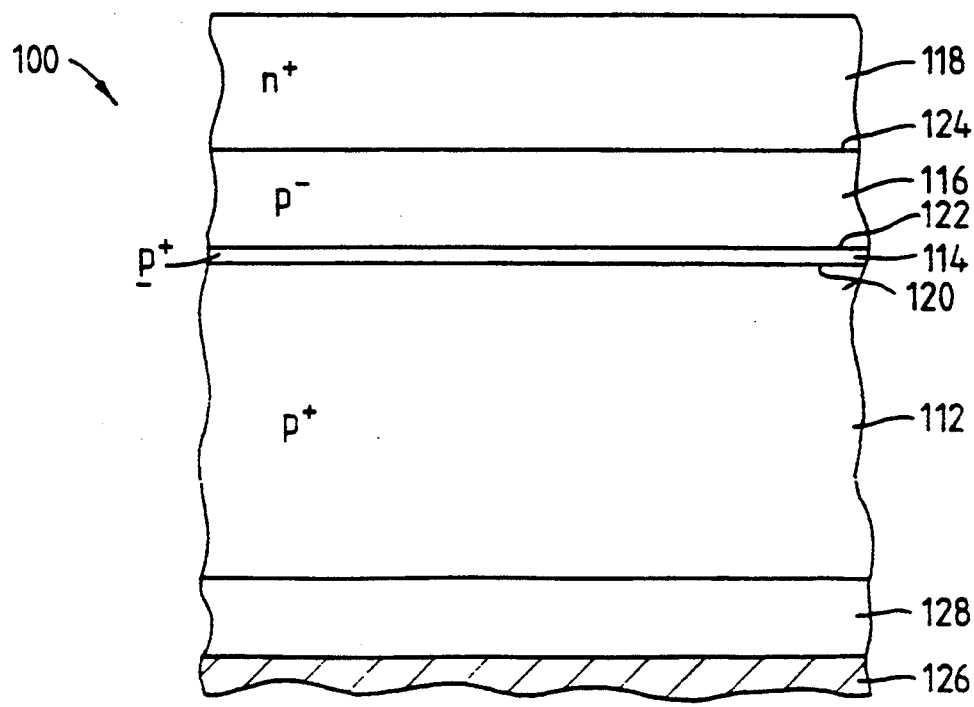
FIG. 6 schematically illustrates a semiconductor heterostructure grown produce a MISFET of the invention.

Referring now to FIG. 6, a semiconductor heterostructure 100 as grown to produce a MISFET of the invention is illustrated schematically. Here MISFET is an acronym of Metal-Insulator-Semiconductor Field Effect Transistor. The heterostructure 100 is similar to the heterostructure 10 used to construct the diode 30, and is grown similarly to the heterostructure 10. Parts common to FIGS. 1 and 2 are similarly referenced but with the addition of a prefix 100. The p+, p+, p$^-$ and n+ regions 112, 114, 116 and 118 respectively are arranged in upward succession as described in relation to regions 12 to 18 in the heterostructure 10. The p+ region 112 is adjacent to a ramp region 128. Regions 112, 116 and 118 are formed of appropriately doped InSb of widths 2.0 microns, 0.25 microns and 0.75 microns respectively. Region 114 is formed of appropriately doped In$_{0.9}$Al$_{0.1}$Sb of width 20nm. The dopant in p-type regions 112 and 114 is beryllium and in the n-type region 118 is silicon. Doping levels are $3 \times 10^{18}$ atoms cm$^{-3}$ in regions 112 and 114, $1 \times 10^{15}$ atoms cm$^{-3}$ in region 116 and $2 \times 10^{18}$ atoms cm$^{-3}$ in region 118. These doping levels are estimated electrically active levels, the chemical level of dopant will be slightly higher in each case. Doping in the p$^-$ region 116 is generally achieved due to machine impurity background. However, the doping may also be achieved conventionally as for the other regions 112, 114 and 118 if a higher doping level is desired. It is convenient but not essential for regions 112 and 114 to have like doping levels.

Referring now also to FIG. 7, steps in the process of fabricating a MISFET 200 from the heterostructure 100 shown in FIG. 6 are schematically illustrated in drawing parts 7(a) to 7(d). Parts described earlier are like referenced. The MISFET fabrication is performed on the InSb substrate 126 using a mask set which gives several hundred transistors 200 in an array. The heterostructure 100 grown as described above is cleaved into 6 mm by 6 mm square chips. A chip is then etched to form a number of transistors each within a respective area 100 microns square. Each chip also has a region free of transistors upon which terminals and common connections are formed. As shown in FIG. 7(a), etching of the chip produces source and drain mesas, 202 and 204 respectively, for each transistor 200. A gate depression 205 is then formed between the source and drain mesas 202 and 204. The depression 205 has a depth of 1.0 microns, a length of 20 microns and a width perpendicular to the plane of FIG. 7 of 40 microns. A further etching stage is then performed to define the limits of each transistor 200, as shown in FIG. 7(b). This involves etching down into the p+ region 112 to leave source and drain mesas 202, 204 as part of a remaining upstanding portion 206 incorporating regions 114 to 118 and part of region 112. This etching also leaves an exposed surface 208 of the p+ semiconductor region 112. The upstanding portion 206 and the surface region 208 are anodized, then silicon oxide ($SiO_x$) is sputtered on and preferentially etched to form a gate insulator 210 and source and drain contact insulators 212 and 214 respectively, as shown in FIG. 7(c). An area 221 of the surface region 208 is masked (not shown) during sputtering to keep it free of silicon oxide. As shown in FIG. 7(d), the following metal contacts are subsequently deposited: gate 216, source 218, drain 220 and common 222.

Carrier extraction and exclusion take place in the MISFET when biased for normal operation. As in the case of the diode 30, the n+p- junction 124 in the drain mesa 204 acts as an extracting contact removing electrons (minority carriers) from the region 116. Such electrons cannot be replenished from the region 114, because it acts in combination with the region 112 as an excluding contact and a potential barrier to electrons. The electron concentration in region 116 therefore falls when the MISFET 200 is biased, and with it the hole concentration in that region. This greatly reduces the conductivity in the region 116, which therefore reduces the leakage current between the source 202 and drain 204.

As illustrated in FIG. 7, the excluding contact regions 112/114 extend across the full width of the MISFET 200. This is not in fact essential in an enhancement mode MISFET: this device is required to have carrier exclusion in the region 116 in the immediate vicinity of the n+p- junction 124 in the drain mesa 204, but not necessarily elsewhere in the region 116. This is not however the case for embodiments to be described later.

Figure 8:
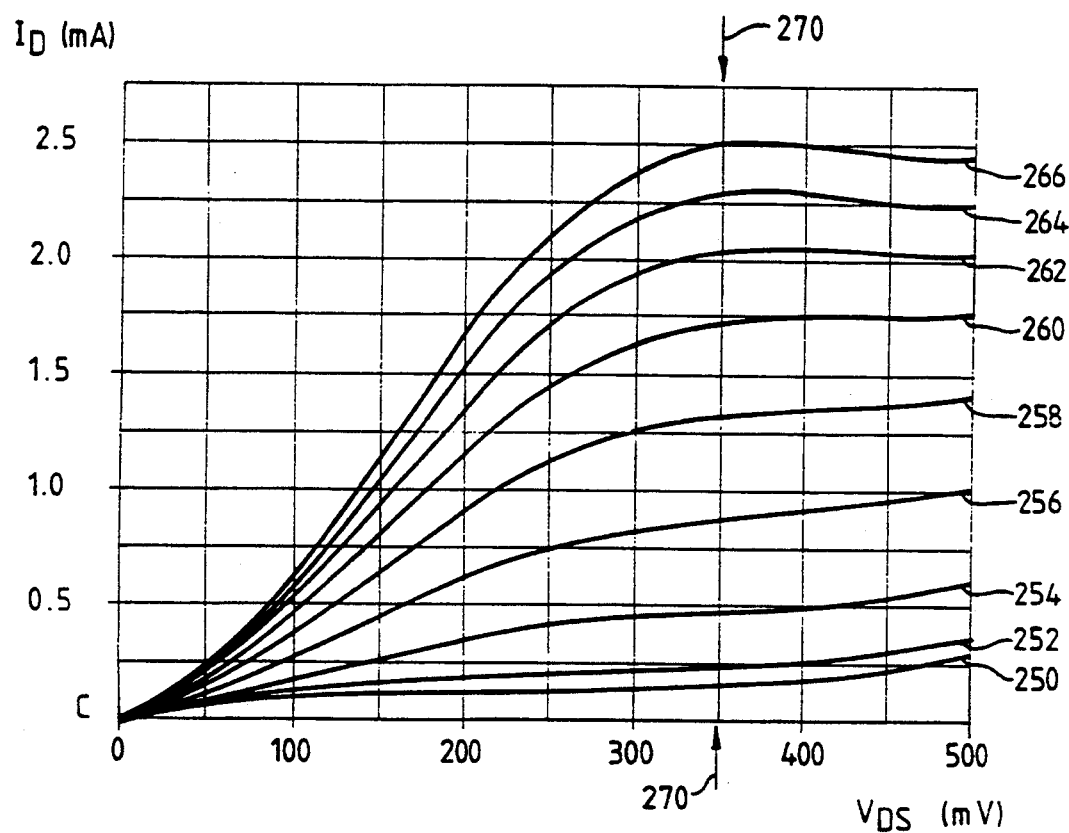
FIG. 8 graphically illustrates output characteristics of a MISFET of the invention.

Referring now also to FIG. 8, output characteristics at room temperature of the MISFET 200 are illustrated graphically. FIG. 8 shows curves 250 to 266 of the variation of drain current $I_D$ with drain-source voltage $V_{DS}$ for nine different values of gate voltage $V_G$; $V_G$ is measured relative to the source contact. Curve 250 corresponds to $V_G$ of 1.5V and curve 266 to $V_G$ of 5.5V. The curves 252 to 264 correspond to values of $V_G$ intermediate these two values and increasing in steps of 0.5V; i.e. curve 250+2N corresponds to $V_G = 1.5 + 0.5N$, where N=0 to 8. The output characteristics are generally of the classical form for MISFETs, which is evidence that a viable MISFET has been produced. At a typical operating drain-source voltage $V_{DS}$ of 350mV indicated by arrows 270, the drain current is switchable from 2.5mA (curve 266) to just under 0.16mA (curve 250) by changing the gate voltage $V_G$ from 5.5V to 1.5V. These output characteristics correspond to a dynamic range of 23dB and a maximum transconductance ($g_m$) of 25 milli-Siemens pep mm ($mSmm^{-1}$). It is believed that this is the first known example of an enhancement mode MISFET made of narrow band semiconductor materials ($E_g < 0.7eV$). A prior art depletion mode device is known having a dynamic range of only 7dB, as previously mentioned.

Parameters such as region widths, doping levels and material composition x may be varied to optimise device characteristics for particular uses. For a MISFET region widths may be within the following ranges; p+ region 112 greater than 0.1 microns, p+ region 114 from 2nm to the critical thickness for strain relief, p- region 116 greater than 0.1 microns, n+ region 118 greater than 0.1 microns. The critical thickness varies with growth conditions, but is in the region of 50nm for an $InSb/In_{1-x}Al_xSb$ heterostructure.

The MISFET 200 is an $InSb/In_{1-x}Al_xSb$ heterostructure. There are a number of other semiconductor material combinations that are suitable for construction of devices of to the invention. The criteria for selecting such material combinations will now be described. First and second narrow bandgap semiconductor materials are required. The second material requires a bandgap which is wider than that of the first. The two semiconductor materials need not be lattice matched. The wider bandgap second material should produce an energy barrier in the minority carrier band which reduces leakage currents by a factor which depends exponentially on the potential step V in the minority carrier band and hyperbolically on the barrier width and minority carrier diffusion length. The reduction in leakage current required will depend on the application of the particular device in question. However, for example, to obtain a 10% reduction in leakage current in the InAlSb MISFET device 200, $V_{ps}$, should be approximately kT/q; here q is the electronic charge, k is Boltzmann's constant and T is the operating temperature. To obtain at least a 50% reduction in leakage current, $V_{ps}$ should be at least 3kT/q; values of $V_{ps}$, of 5kT/q and 8kT/q correspond approximately to reductions in leakage current of 90% and 99% respectively.

Combinations of materials that may comply with the above $V_{ps}$ criteria with suitably chosen composition parameters x, or x and y, include $In_{1-y}Al_ySb/In_{1-x}Al_xSb$, PbSe/PbS, $InAs/InAs_{1-x}P_x$, $InAs_{1-x}Sb_x/In_{1-y}Al_ySb$, $InAs_{1-x}Sb_x/InAs_{1-y}P_y$, $GaAs/Ga_{1-x}Al_xAs$, $In_{1-x}Ga_xSb/In_{1-y}Al_ySb$ and $Hg_{1-x}Cd_xTe/Hg_{1-y}Cd_yTe$. InSb/InAlSb, from the embodiments described above is constructed, is a special case of the first of these with the parameter y equal to zero.

For semiconductor systems in which the / relatively narrow bandgap material has a bandgap significantly less than that in silicon or gallium arsenide, i.e. a bandgap $E_g$ of less than or about 0.5eV, there are advantages due to the speed of carrier flow. Low bandgap materials are often characterised by high carrier mobility. They have been ignored for conventional signal processing systems because thermal excitation of carriers in them is unacceptable at room temperature. The present invention provides the potential for devices to be constructed to operate at speeds faster than is possible in either silicon or gallium arsenide. For instance the maximum speed of carrier flow in InSb is of the order of a factor of five faster than in silicon. There are also advantages relating to the power dissipation in the narrow bandgap materials. For example, in a bipolar transistor the power-delay product (Pt) figure of merit is, fundamentally, determined by the energy dissipated in charging and discharging the emitter-base junction capacitance. $CV^2/2$, where C is the capacitance and V the voltage which it is charged. Both parameters C and V can be substantially reduced in the narrow bandgap materials.

The current I which can flow through a forward biased emitter-base junction is given by:

$$I = I_0(e^{qV/kT} - 1) \qquad (4)$$

The value of $I_0$ can vary by many orders of magnitude from one semiconductor to another. However, the most significant term in $I_0$ is the square $n_i^2$ of the intrinsic carrier concentration $n_i$, i.e.

I is approximately proportional to $n_i^2(e^{qV/kT}-1)$ (5)

For large forward bias, this gives:

I is approximately proportional to $e^{-E_g/kT}$
$e^{qV/kT} = e^{(q/kT)(V-E_g/q)}$ (6)

To obtain a given current, therefore, the applied voltage should be approximately $(E_g/q)+C$, where C is only a weak function of the type of semiconductor. In order to achieve the maximum current from the transistor, the emitter-base junction is biased to a virtually flat-band condition, i.e. $V_{max}$ is approximately $E_g/q$. Hence $I_{max}$ tends to a constant for all semiconductors, independent of bandgap, and the necessary applied voltage is approximately equal to the bandgap, e.g. $V_{InSb}$ is approximately $V_{si}/5$. Thus the power in a switching circuit may be reduced by a factor of up to 25.

In a logic circuit the time for the transistor to switch between states is fundamentally determined by the carrier transit time from the neutral region of the emitter to the neutral region of the collector. In the limit, this is equal to $d_{dep}/v_s$, where $d_{dep}$ is the distance to contain the emitter-base and base-collector depletion regions, and $v_s$ is the saturated carrier velocity. The capacitance C of each depletion region is inversely proportional to its width; hence, for a given switching time, C is approximately proportional to $1/v_s$. Moreover, for example, $C_{InSb}$ is approximately equal to $C_{si}/5$, where $C_{InSb}$ and $C_{si}$ are the values of C in InSb and Si respectively. Hence the power P is also reduced by an additional factor of 5.

The invention is not limited to the devices described thus far. In addition to MISFETs other forms of transistor may also be constructed, for example junction FETs, depletion mode FETs, enhancement mode FETs and hereto junction bipolar transistors. More generally the heterostructure described may be employed in any heterostructure device where difficulties exist in forming contacts to a wide bandgap p-type material.

Figure 9:
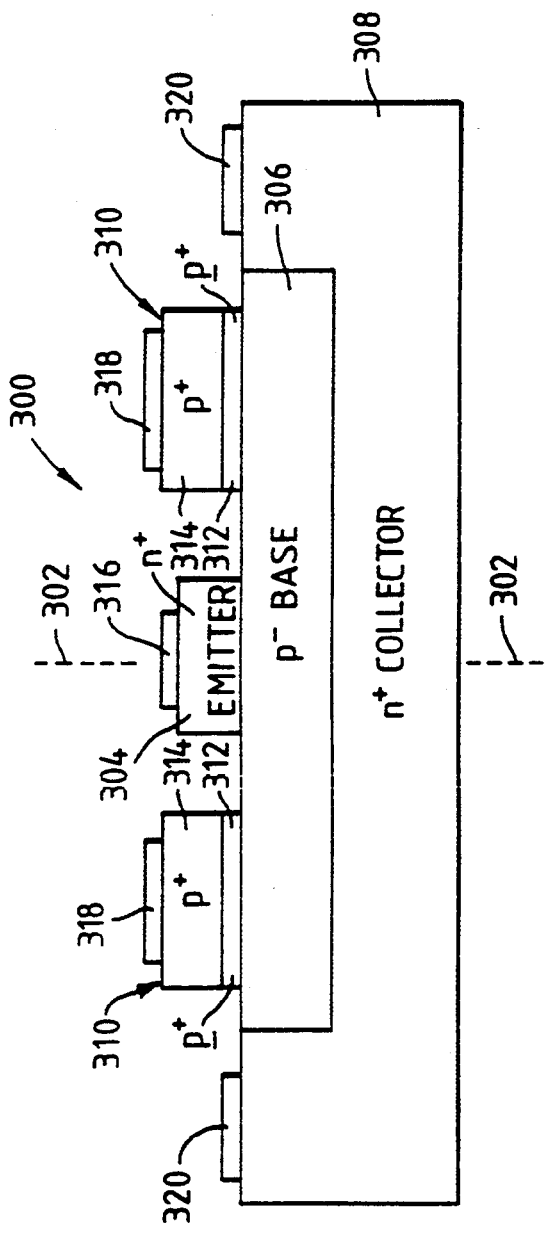
FIG. 9 is a schematic cross-sectional view of a bipolar transistor of the invention.

Referring now to FIG. 9, there is shown a further embodiment of the invention in the form of a bipolar transistor indicated generally by 300. The transistor 300 is of generally disc-shaped construction, and is illustrated in section through a diameter and through the disc symmetry axis indicated by chain lines 302. It has an n+ emitter 304, a p− base 306 and an n+ collector 308. An excluding contact 310 of annular shape is connected to the base 306, the contact incorporating a p+ lower layer 312 and a p+ upper layer 314. The transistor 300 has electrical bias electrodes 316, 318 and 320 for the emitter 304, base 306 and collector 308 respectively.

The transistor 300 is formed of InSb and $In_{0.9}Al_{0.1}Sb$ with dopant species and concentrations as previously described; i.e. regions 304, 306, 308, 312 and 314 have compositions like to those of regions 118, 116, 118 (once more), 114 and 112 respectively in the heterostructure 100 of FIG. 6.

The operation of the transistor 300 is as follows. Bias voltages are applied to the electrodes 316, 318 and 320 to achieve transistor operation with base current drawn through the base electrode 318. Minority carriers are extracted from the base 306 by the n+p− interfaces between the emitter 316 and base 306 and collector 308 and base 306, which are extracting contacts. These carriers cannot be replenished from the p+p+ excuding contact formed by layers 312 and 314. The minority carrier concentration therefore falls in the base 306, and with it that of majority carriers from charge neutrality considerations. This reduces the base conductivity. Conduction through the base 306 between the emitter 304 and collector 308 is therefore a function of the base bias current in addition to the bias voltages on the emitter/base and base/collector junctions. This makes it possible to achieve relatively high dynamic range in the ratio of collector currents between transistor "ON" and "OFF" states. The transistor 300 is therefore suitable for digital switching applications.

Unlike the MISFET 200, it is important that carrier extraction and exclusion take place over substantially all of the base 306 in order to achieve good transistor performance, this is because a non-extracted region extending between emitter and collector acts as a short circuit.

Figure 10:
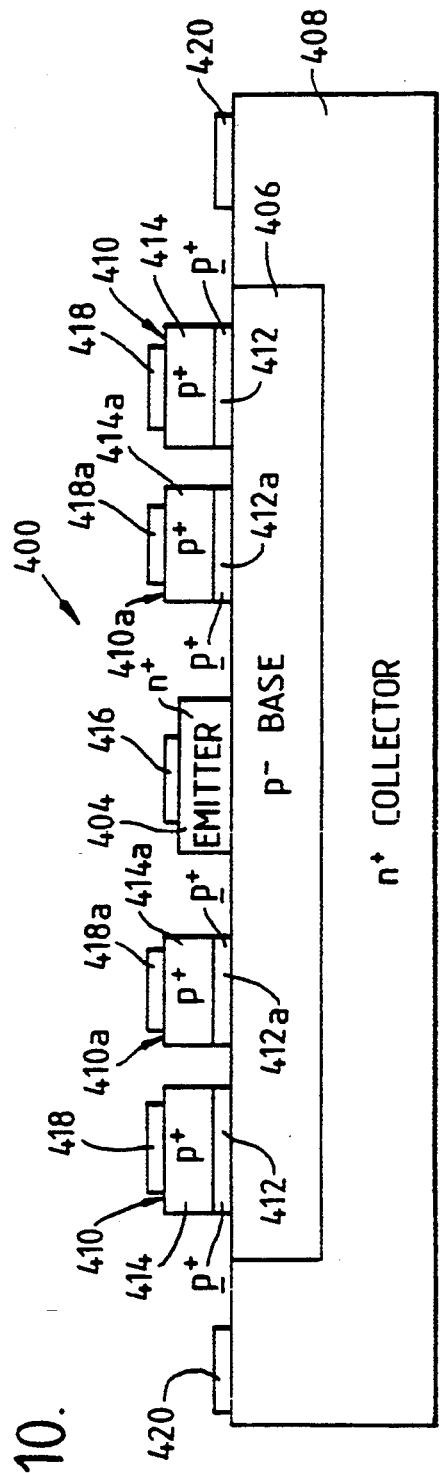
FIG. 10 is a schematic cross-sectional view of a further embodiment of a bipolar transistor of the invention.

Referring now also to FIG. 10, a further bipolar transistor embodiment of the invention is shown and is indicated generally by 400. It is similar to the transistor 300, and like features are like referenced with a prefix 400 substituted for 300. The following description will be directed to aspects of difference. As compared to the transistor 300, the transistor 400 has an additional annular base contact assembly indicated by suffix "a" to its elements; these elements are an excluding contact 410a, its lower and upper layers 412a and 414a, and a base bias terminal 418a.

The additional base contact 410a is an A.C. signal input, and is interposed between a D.C. bias current base contact 410 and an emitter 404. The transistor 400 is D.C. biased as described for the previous embodiment 300 using bias electrodes 416, 418 and 420. An A.C. signal is then applied to the signal base electrode 418a, and this signal produces modulation of the transistor current with consequent amplification. The transistor 400 has the advantage that electrical noise associated with the comparatively large base bias current does not appear on the much smaller A.C. input signal. This embodiment therefore appropriate for small signal analogue amplification.

We claim:

1. A semiconductor device having first, second and third semiconducting region connected in series for current input, current control and current output respectively and each arranged to be biased by a respective biasing means, wherein the device includes an extracting contact comprising a means for extracting minority carriers from the second region and the second region is of low doping and has a common interface with a fourth semiconducting region, said fourth semiconducting region having a common interface with a fifth semiconducting region, and wherein the fourth region:

(a) has like majority carrier type to that of the fifth region, (b) is biasable through the fifth region and comprises an excluding contact means for excluding minority carriers from at least parts of the second region adjacent the third region and thereby to reduce the intrinsic contribution to current reaching the third region, (c) has a bandgap sufficiently large to provide a potential energy barrier to minority carrier flow from the fifth region to the second region, (d) has sufficiently high doping to counteract potential barrier impediment to majority carrier flow from the second region to the fifth region, and (e) is less wide than a critical thickness associated with dislocation formation but sufficiently wide to inhibit tunnelling of minority carriers from the fifth region to the second region.

2. A device according to claim 1 wherein it is a field effect transistor in which the first, second and third regions are source, gate and drain regions respectively, and the first and third regions are of like majority carrier type opposite to that of the fourth and fifth regions.

3. A device according to claim 2 wherein it is an enhancement mode field effect transistor in which the second region is of like majority carrier type to that of the fourth and fifth regions.

4. A device according to claim 3 wherein the second region is a layer having first and second sides separated by the layer thickness, the first and third regions are connected to the first side of the second region, the fourth region is connected to the second side of the second region and the fifth region is connected to a side of the fourth region remote from the first, second and third regions.

5. A device according to claim 4 wherein the fourth region is connected to the second region over an area at least as extensive and correspondingly located as those parts of the second region adjacent and between the first and third regions, the fourth region being arranged to provide minority carrier exclusion over most or all of the second region.

6. A semiconductor device having first, second and third semiconducting regions connected in series for current input, current control and current output respectively and each arranged to be biased by a respective biasing means, wherein the device includes an extracting contact comprising a means for extracting minority carriers from the second region, and the second region is of low doping and has a common interface with a fourth semiconducting region, said fourth semiconducting region having a common interface with a fifth semiconducting region, and wherein the fourth region:

(a) has like majority carrier type to that of the fifth region, (b) is biasable through the fifth region and comprises an excluding contact means for excluding minority carriers from at least parts of the second region adjacent the third region and thereby to reduce the intrinsic contribution to current reaching the third region, (c) has a bandgap sufficiently large to provide a potential energy barrier to minority carrier flow from the fifth region to the second region, (d) has sufficiently high doping to counteract potential barrier impediment to majority carrier flow from the second region to the fifth region, and (e) is less wide than a critical thickness associated with dislocation formation but sufficiently wide to inhibit tunnelling of minority carriers from the fifth region to the second region wherein the fourth region bandgap is at least 3 kT/q Volts wider than at least one of said second region and said fifth region, where q is the electronic charge, k is Boltzmann's constant and T is the device operating temperature.

7. A semiconductor device having first, second and third semiconducting regions connected in series for current input, current control and current output respectively and each arranged to be biased by a respective biasing means, wherein the device includes an extracting contact comprising a means for extracting minority carriers from the second region, and the second region is of low doping and has a common interface with a fourth semiconducting region, said fourth semiconducting region having a common interface with a fifth semiconducting region, and wherein the fourth region:

(a) has like majority carrier type to that of the fifth region, (b) is biasable through the fifth region and comprises an excluding contact means for excluding minority carriers from at least parts of the second region adjacent the third region and thereby to reduce the intrinsic contribution to current reaching the third region, (c) has a bandgap sufficiently large to provide a potential energy barrier to minority carrier flow from the fifth region to the second region, (d) has sufficiently high doping to counteract potential barrier impediment to majority carrier flow from the second region to the fifth region, and (e) is less wide than a critical thickness associated with dislocation formation but sufficiently wide to inhibit tunnelling of minority carriers from the fifth region to the second region wherein:

(a) the first and third regions are of InSb having an n-type dopant concentration of at least $2 \times 10^{17}$ atoms/cm$^3$, (b) the second region is of InSb having a p-type dopant concentration of less than $1 \times 10^{17}$ atoms/cm$^3$, (c) the fourth region is of $In_{1-x}Al_xSb$ having a p-type dopant concentration of at least $5 \times 10^{17}$ atoms/cm$^3$, where x is a compositional parameter in the range 0.01 to 0.7, and (d) the fifth region is of InSb with a p-type dopant concentration of at least $5 \times 10^{17}$ atoms/cm$^3$.

8. A device according to claim 7 wherein the fourth region bandgap is at least 5 kT/q Volts wider than at least one of said second region and said fifth region, where q is the electronic charge, k is Boltzmann's constant and T is the device operating temperature.

9. A device according to claim 1 wherein it is formed from a series of layers disposed successively on a common substrate, the fifth region being a first layer supported by the substrate, the fourth region being a second layer in contact with the fifth layer, the second region being a third layer in contact with the second layer, and the first and third regions being formed from a common fourth layer in contact with the third layer.

10. A device according to claim 1 wherein said device is a bipolar transistor in which the first, second and third regions are emitter, base and collector regions respectively, the first and third regions are of like majority carrier type opposite to that of the second, fourth and fifth regions, and the fourth region comprises a means for providing minority carrier exclusion effects over substantially all of the second region.

11. A semiconductor device having first, second and third semiconducting regions connected in series for current input, current control and current output respectively and each arranged to be biased by a respective biasing means, wherein the device includes an extracting contact comprising a means for extracting minority carriers from the second region, and the second region is of low doping and has a common interface with a fourth semiconducting region, said fourth semiconducting region having a common interface with a fifth semiconducting region, and wherein the fourth region:
  (a) has like majority carrier type to that of the fifth region,
  (b) is biasable through the fifth region and comprises an excluding contact means for excluding minority carriers from at least parts of the second region adjacent the third region and thereby to reduce the intrinsic contribution to current reaching the third region,
  (c) has a bandgap sufficiently large to provide a potential energy barrier to minority carrier flow from the fifth region to the second region,
  (d) has sufficiently high doping to counteract potential barrier impediment to majority carrier flow from the second region to the fifth region, and
  (e) is less wide than a critical thickness associated with dislocation formation but sufficiently wide to inhibit tunnelling of minority carriers from the fifth region to the second region;
wherein said device is a bipolar transistor in which the first, second and third regions are emitter, base and collector regions respectively, the first and third regions are of like majority carrier type opposite to that of the second, fourth and fifth regions, and the fourth region is arranged to provide minority carrier exclusion effects over substantially all of the second region wherein the second region is a layer having first and second sides separated by its layer thickness, the first and third regions are connected respectively to the first and second sides of the second region, and the fourth region is connected on one side to the first side of the second region and on the other side to the fifth region.

12. A device according to claim 11 wherein the second region is associated with a further biasing means connected to a different part of the second region to that to which the fourth region is connected, and the further biasing means incorporates semiconducting regions of like composition to those of the fourth and fifth regions.

13. A device according to claim 12 wherein the further biasing means and the fourth region are annular and are both disposed about the first region.

14. A device according to claim 10 wherein the fourth region bandgap is at least 3 kT/q Volts wider than at least one of said second region and said fifth region, where q is the electronic charge, k is Boltzmann's constant and T is the device operating temperature.

15. A device according to claim 10 wherein:
  (a) the first region and the third region are of InSb having an n-type dopant concentration of at least $2 \times 10^{17}$ atoms/cm$^3$,
  (b) the second region is of InSb having a p-type dopant concentration of less than $1 \times 10^{17}$ atoms/cm$^3$, and
  (c) the fourth region is of $In_{1-x}Al_xSb$ having a p-type dopant concentration of at least $5 \times 10^{17}$ atoms/cm$^3$, where x is a compositional parameter in the range 0.01 to 0.7, and
  (d) the fifth region is of InSb with a p-type dopant concentration of at least $5 \times 10^{17}$ atoms/cm$^3$.

16. A device according to claim 15 wherein the fourth region bandgap is at least 5 kT/q Volts wider than at least one of said second region and said fifth region, where q is the electronic charge, k is Boltzmann's constant and T is the device operating temperature.

17. A semiconductor device comprising a field effect transistor having semiconducting source, gate and drain regions, and wherein the device includes an extracting contact comprising a means for extracting minority carriers from the gate region, the gate region is of low doping and has a common interface with a fourth semiconducting region, said fourth semiconducting region having a common interface with a fifth semiconducting region, the source and drain regions have like majority carrier type opposite to that of the gate region and the fourth and fifth regions, the source, gate and drain regions and the fourth and fifth regions each being of semiconductor bandgap less than 0.7 eV, and the fourth region:
  (a) has like majority carrier type to that of the fifth region,
  (b) is biasable through the fifth region and comprises an excluding contact means for excluding minority carriers from at least parts of the gate region adjacent the drain region and thereby to reduce the intrinsic contribution to current reaching the drain region,
  (c) has a bandgap sufficiently large to provide a potential energy barrier to minority carrier flow from the fifth region to the gate region,
  (d) has sufficiently high doping to counteract potential barrier impediment to majority carrier flow from the gate region to the fifth region, and
  (e) is less wide than a critical thickness associated with dislocation formation but sufficiently wide to inhibit tunnelling of minority carriers from the fifth region to the gate region.

18. A semiconductor device comprising a field effect transistor having source, gate and drain regions and incorporating an extracting contact comprising a means for extracting minority carriers from the gate region, and wherein the gate region is a layer of low doping interfaced on one side with the source and drain regions and on another side with a fourth semiconducting region, said fourth semiconducting region interfaced with a fifth semiconducting region separated from the gate region by the fourth region thickness, the source and drain regions are of like majority carrier type, and the fourth region:
  (a) has like majority carrier type to that of the fifth region and opposite to that of the source and drain regions,
  (b) is biasable through the fifth region and comprises an excluding contact means for excluding minority carriers from at least parts of the gate region adjacent the drain region and thereby to reduce the intrinsic contribution to current reaching the drain region,
  (c) has a bandgap sufficiently large to provide a potential energy barrier to minority carrier flow from the fifth region to the gate region,
  (d) has sufficiently high doping to counteract potential barrier impediment to majority carrier flow from the gate region to the fifth region, and
  (e) is less wide than a critical thickness associated with dislocation formation but sufficiently wide to inhibit tunnelling of minority carriers from the fifth region to the gate region.

19. A device according to claim 18 wherein the fourth region is connected to the gate region over an area at least as extensive and correspondingly located as those parts of the gate region adjacent and between the source and drain regions, the fourth region comprising a means for providing minority carrier exclusion over most of the gate region.

* * * * *